United States Patent [19]

Hine et al.

[11] Patent Number: 4,505,532
[45] Date of Patent: * Mar. 19, 1985

[54] ARRAY PACKAGE CONNECTOR

[75] Inventors: Jean-Patrick Hine, San Carlos; Thomas H. McGaffigan, Redwood City, both of Calif.

[73] Assignee: Raychem Corporation, Menlo Park, Calif.

[*] Notice: The portion of the term of this patent subsequent to Aug. 28, 2001 has been disclaimed.

[21] Appl. No.: 504,916

[22] Filed: Jun. 16, 1983

Related U.S. Application Data

[63] Continuation-in-part of Ser. No. 401,176, Jul. 23, 1982, Pat. No. 4,468,076.

[51] Int. Cl.³ .................. H01R 13/20; H01R 13/635
[52] U.S. Cl. .................. 339/75 M; 174/DIG. 8; 339/17 CF; 339/30; 339/DIG. 1; 339/74 R
[58] Field of Search .......... 174/DIG. 8; 339/17 CF, 339/30, 74 R, 75 R, 75 M, 75 MP, 174, DIG. 1

[56] References Cited

U.S. PATENT DOCUMENTS

| | | | |
|---|---|---|---|
| 3,783,429 | 1/1974 | Otte | 337/393 |
| 3,861,030 | 1/1975 | Otte et al. | 29/626 |
| 3,877,774 | 4/1975 | Dorrell | 339/99 R |
| 4,211,459 | 7/1980 | Madden | 339/75 MP |
| 4,220,389 | 9/1980 | Schell | 339/74 R |
| 4,412,713 | 11/1983 | Nishikawa | 339/75 M |

FOREIGN PATENT DOCUMENTS 50441 4/1982 European Pat. Off. .

OTHER PUBLICATIONS

W. C. Felts et al., "Zero Insertion Force Module Socket", *IBM Technical Disclosure Bulletin*, vol. 17, No. 10, Mar. 1975.

Primary Examiner—Eugene F. Desmond
Assistant Examiner—Steven C. Bishop
Attorney, Agent, or Firm—James W. Peterson

[57] ABSTRACT

A connector is described for electrical connection and, preferably, the removal of an array package having a plurality of pins with a substrate having contact elements. A first board having a plurality of openings formed therethrough and a second parallel board having a plurality of complementary openings formed therethrough are interconnected by a heat-recoverable metal grid. One end of the grid is connected to the first board and the other end of the grid is connected to the second board to move the boards relative to each other to effect engagement between insertable elements, e.g. the contact elements of the substrate and the pins of an array package.

45 Claims, 32 Drawing Figures

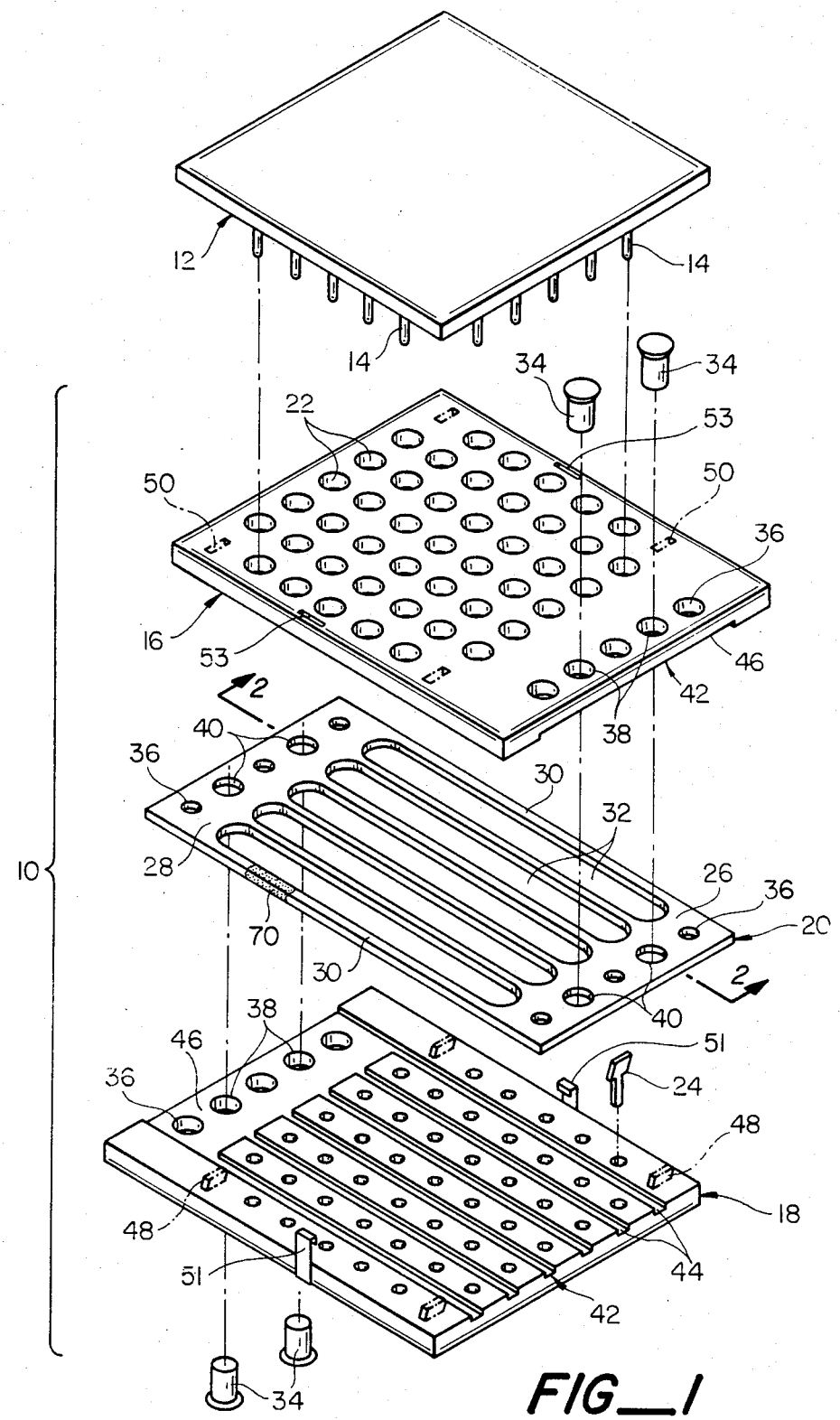
FIG_1

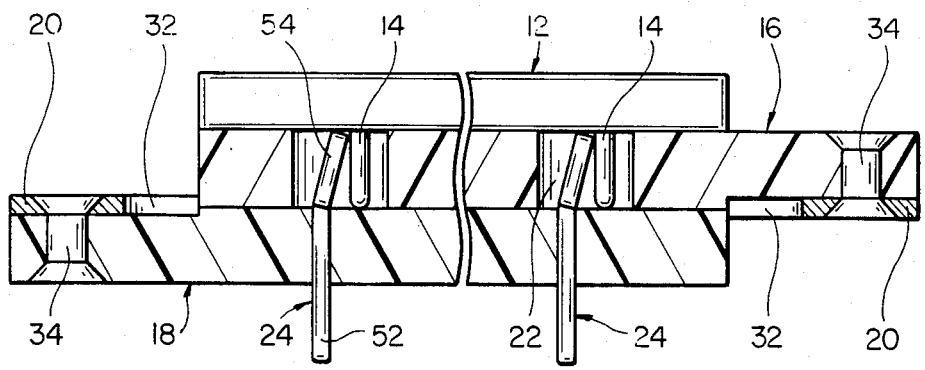
FIG_2
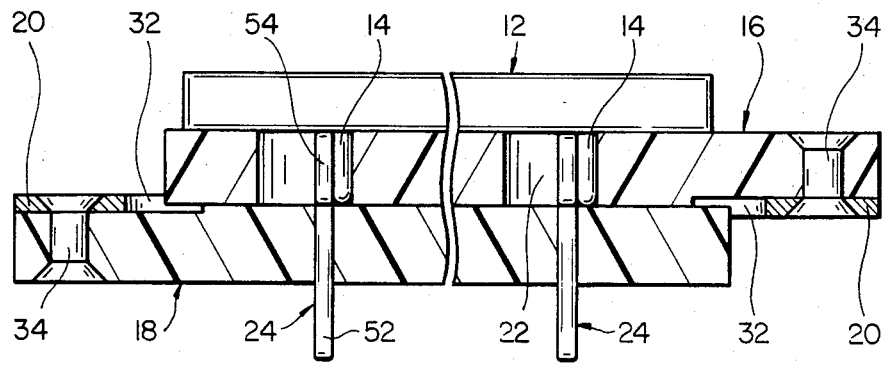
FIG_3
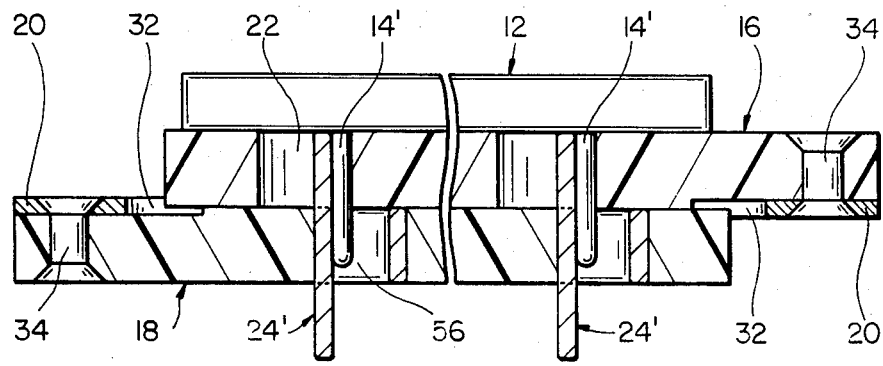
FIG_4

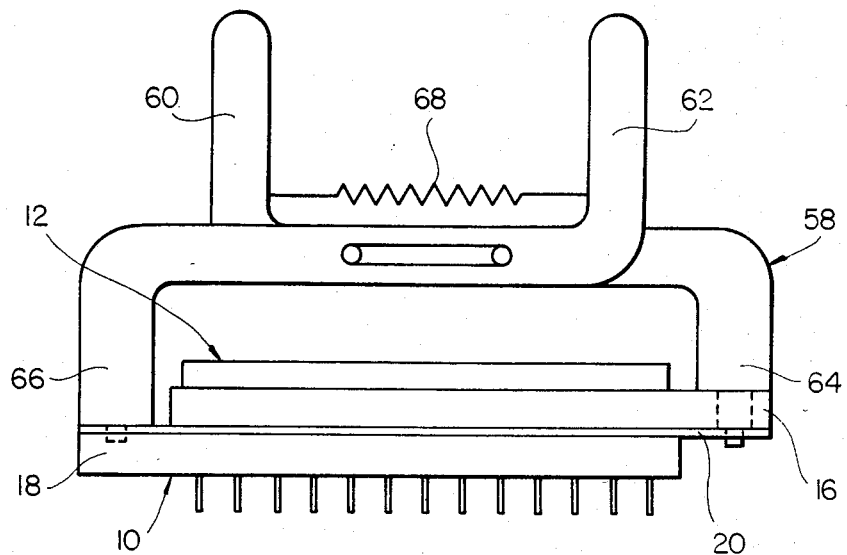
FIG_5
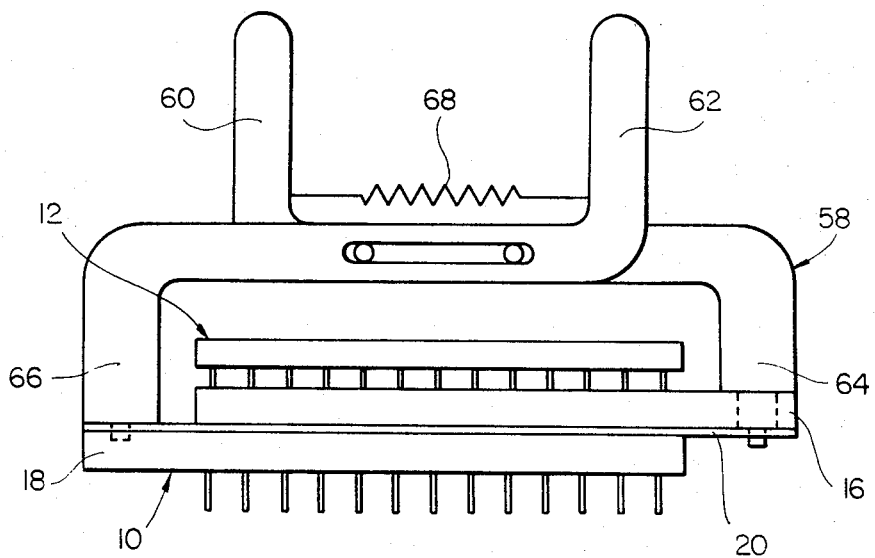
FIG_6

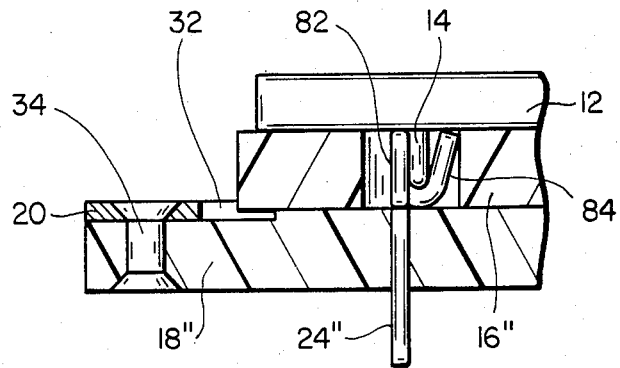
FIG_7
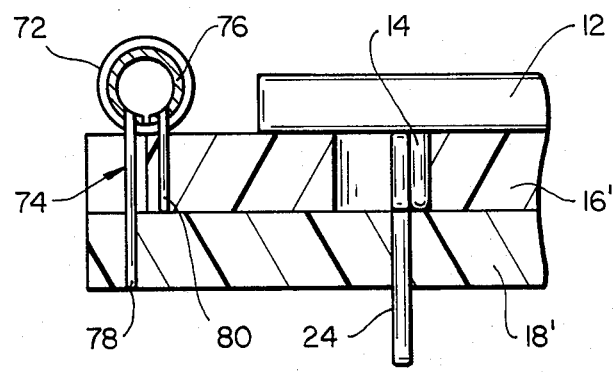
FIG_17

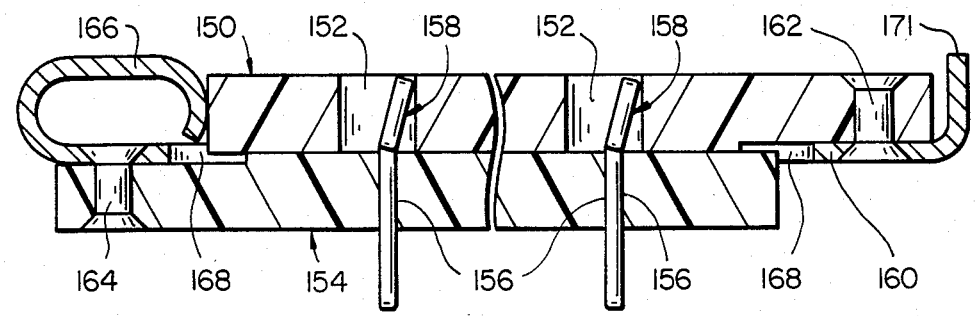
FIG_8
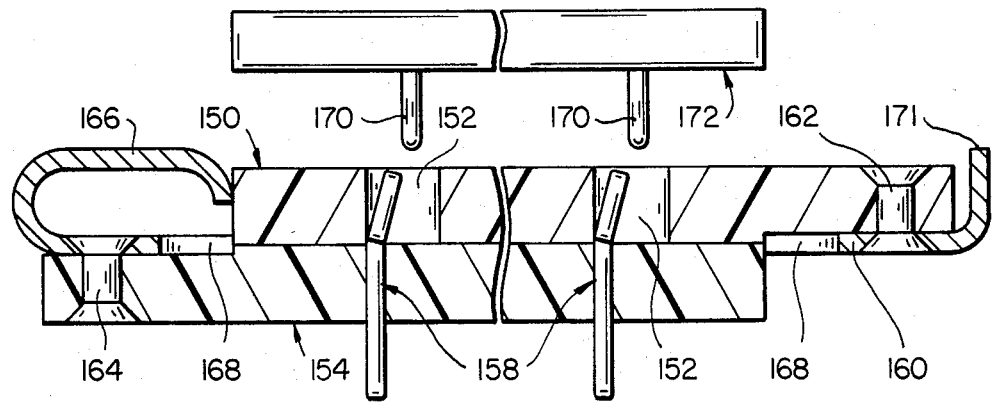
FIG_9
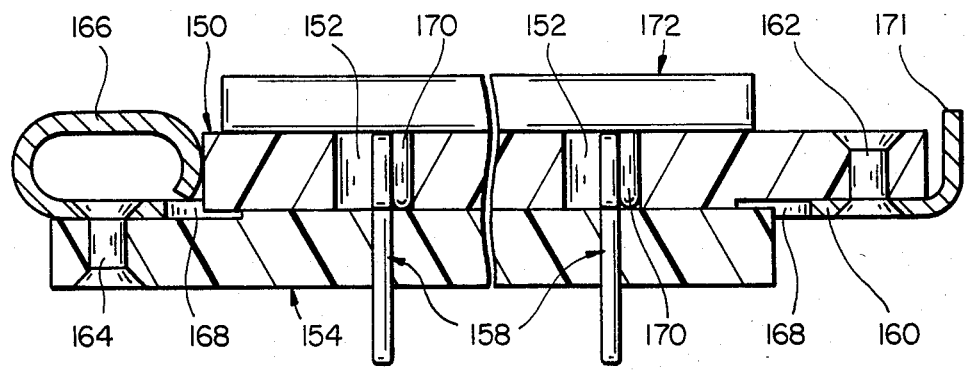
FIG_10

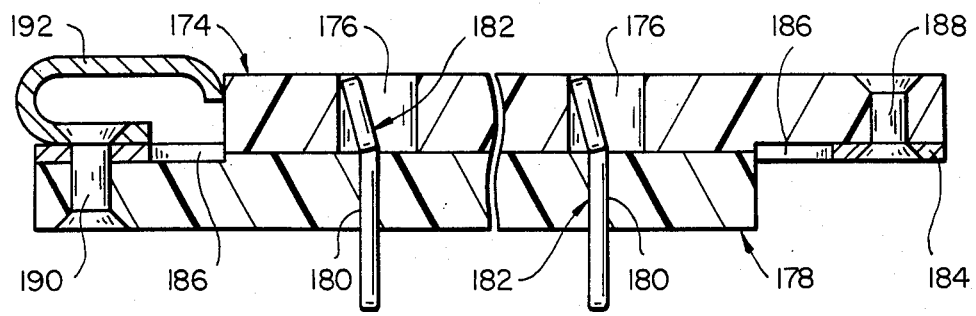
FIG_11
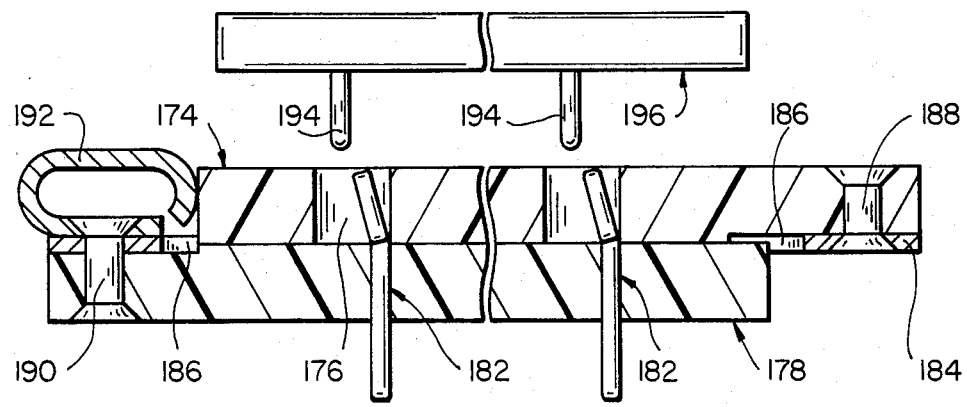
FIG_12
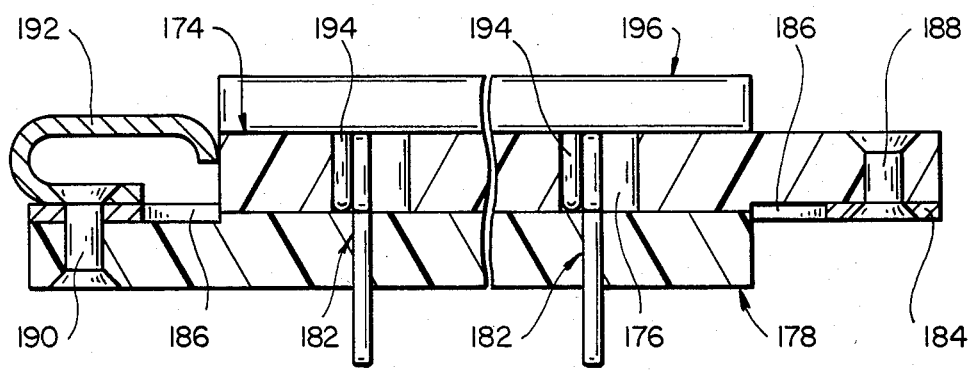
FIG_13

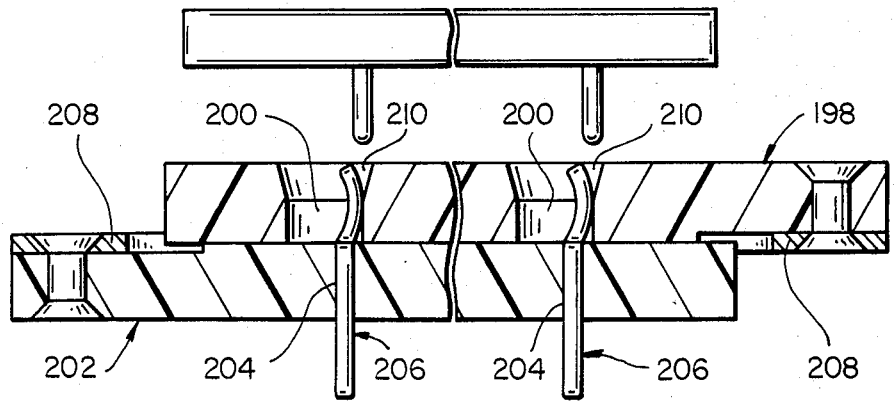
FIG_14
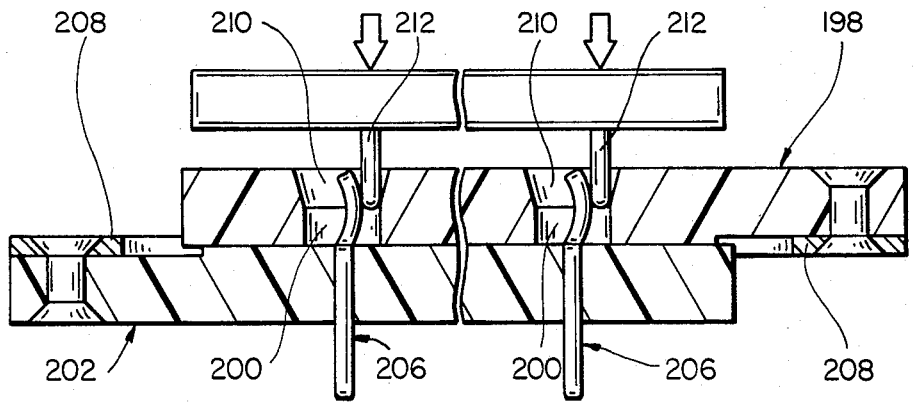
FIG_15
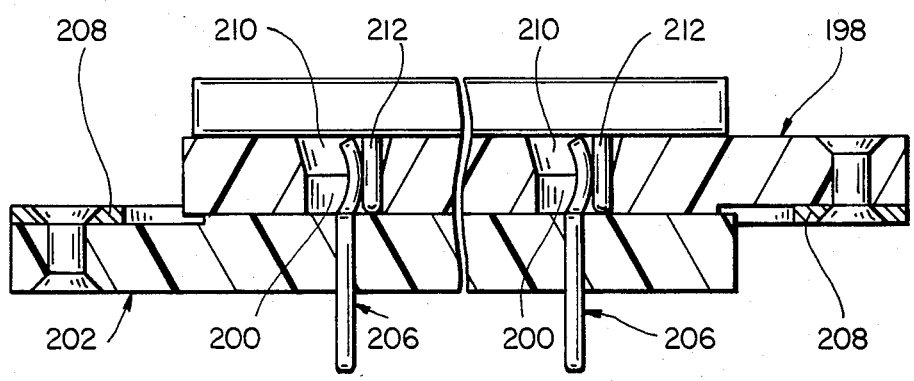
FIG_16

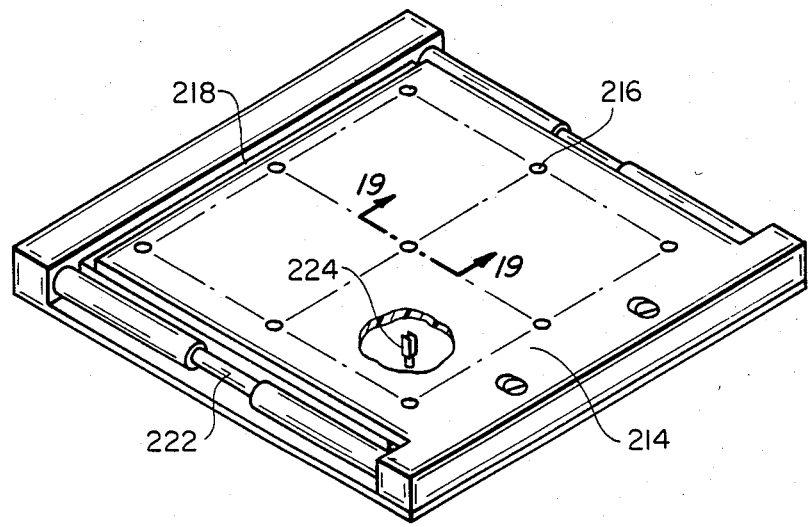
FIG_18
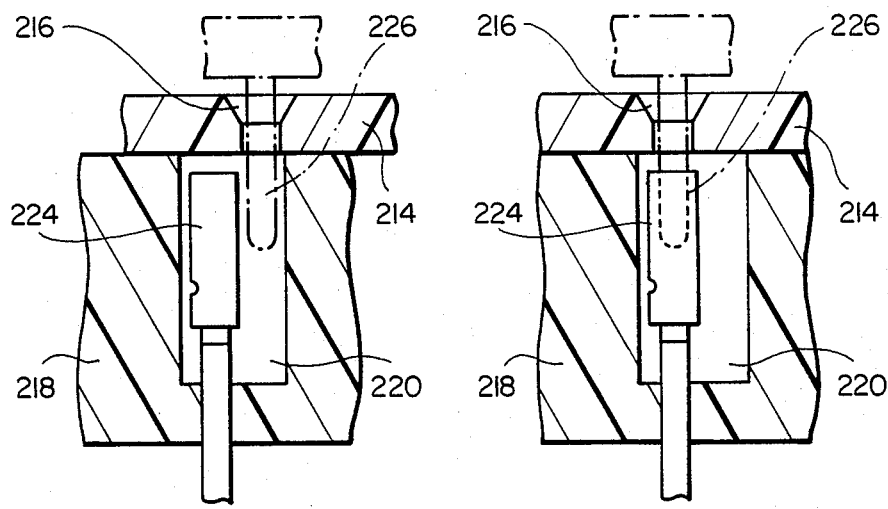
FIG_19  FIG_20

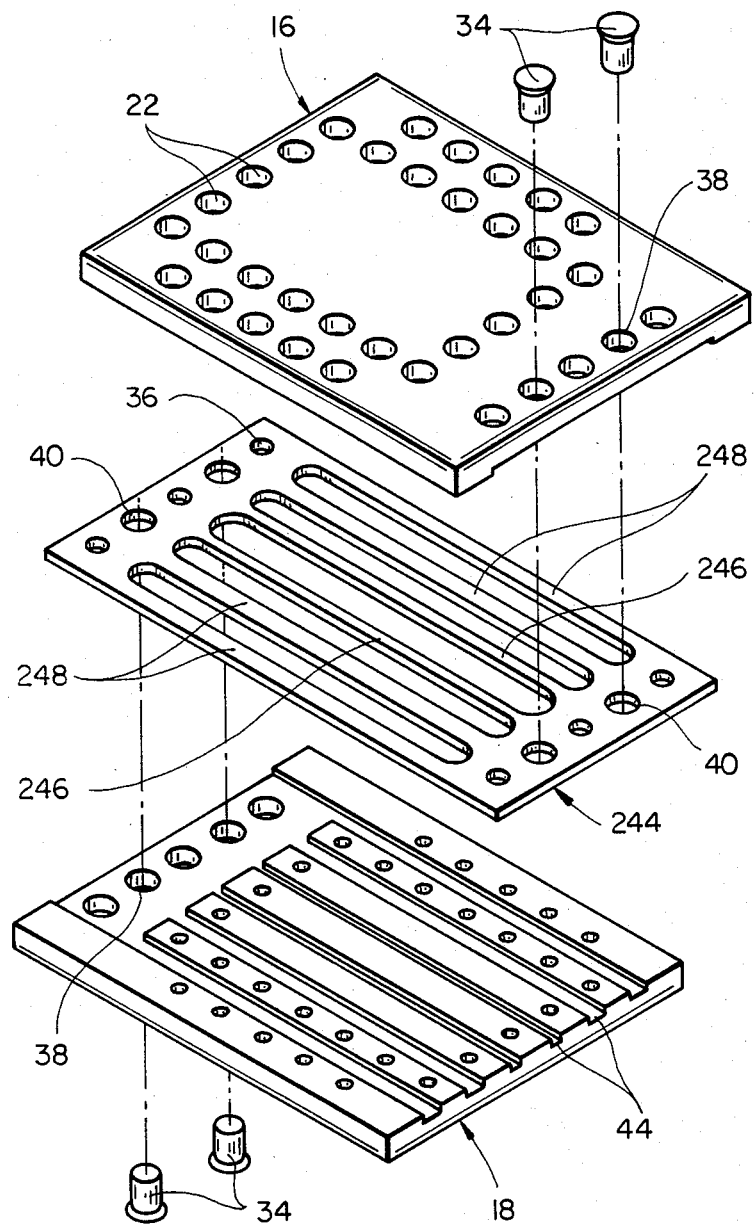
FIG_21

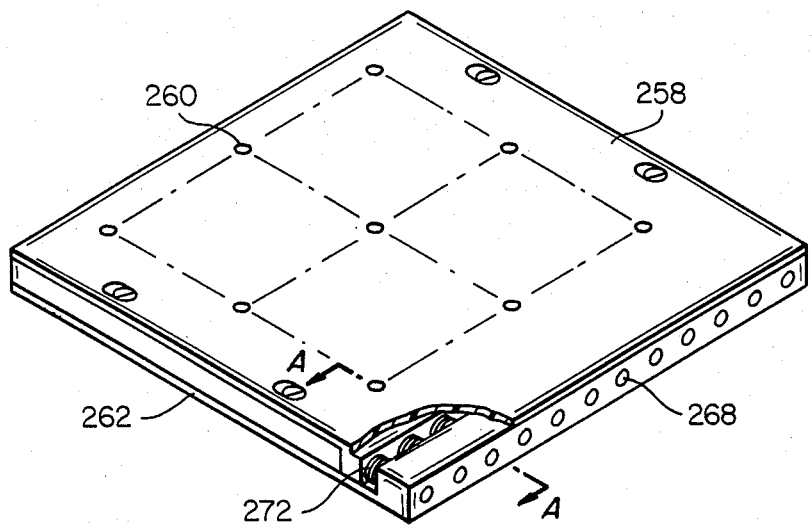
FIG_22
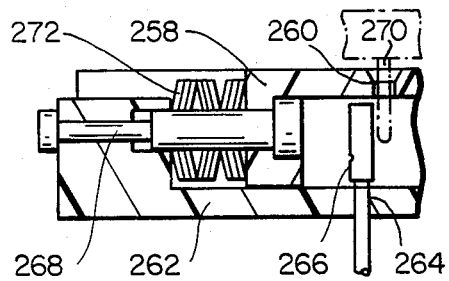
FIG_23
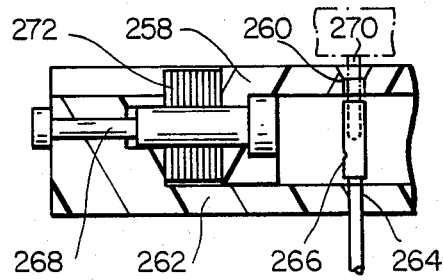
FIG_24
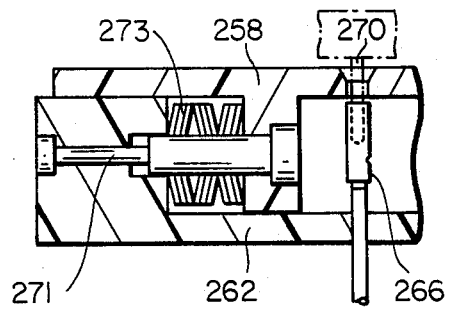
FIG_25
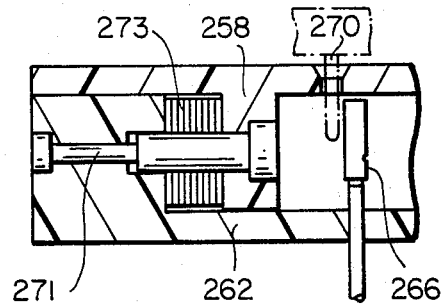
FIG_26

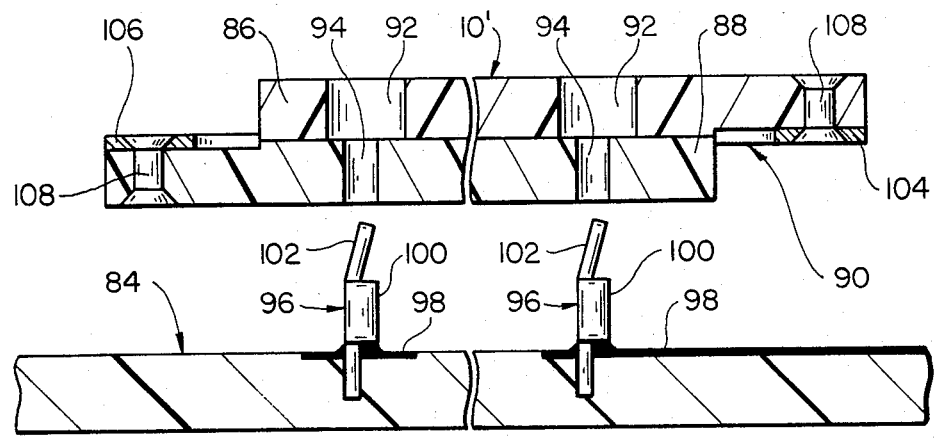
FIG_27
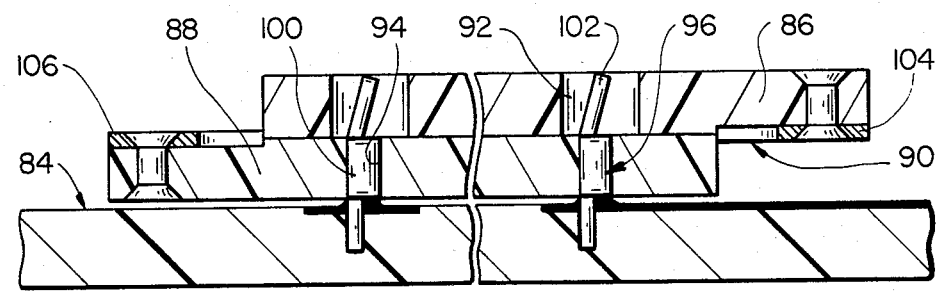
FIG_28
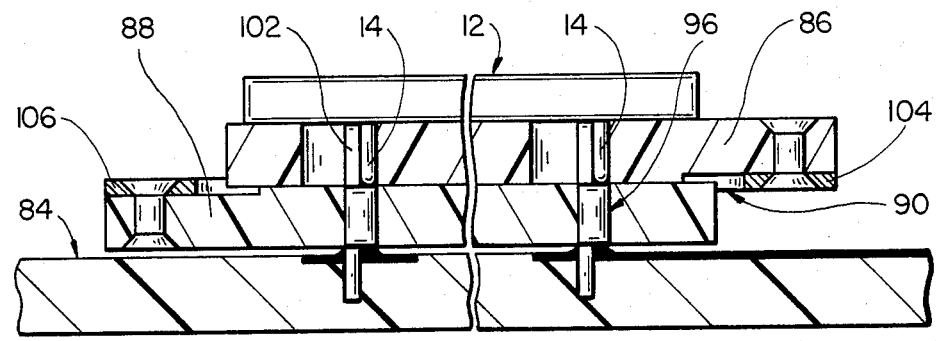
FIG_29

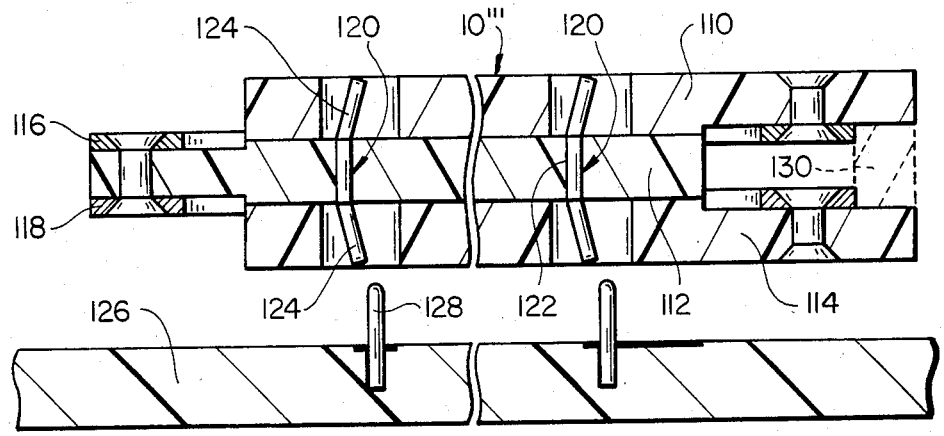
FIG_30
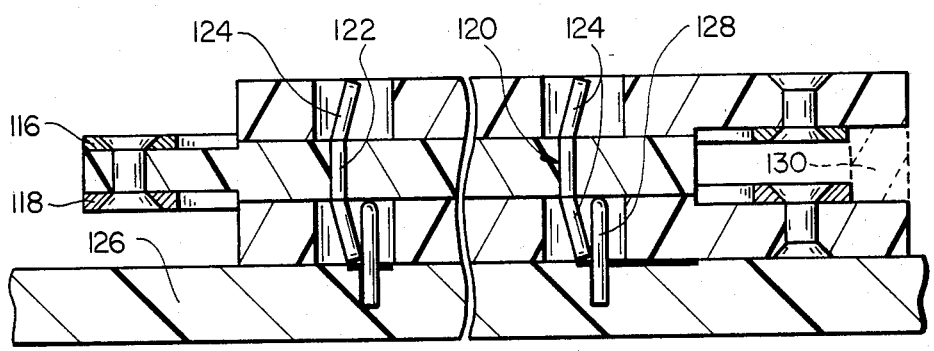
FIG_31
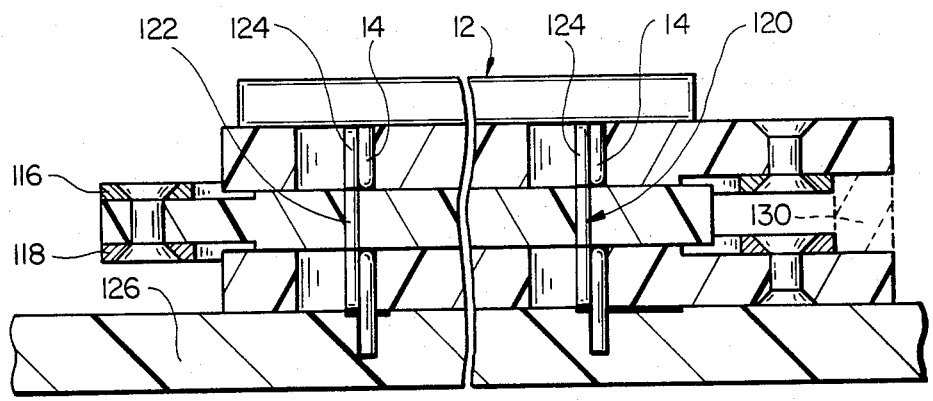
FIG_32

ARRAY PACKAGE CONNECTOR

The instant invention is related to and is a continuation-in-part application of applicants' array package conector and connector tool disclosed in commonly-assigned and co-pending U.S. patent application Ser. No. 401,176, filed July 23, 1982, now U.S. Pat. No. 4,468,076, the disclosure of which is incorporated herein by reference.

BACKGROUND OF INVENTION

Connection of semiconductor devices, such as integrated circuits, has become increasingly difficult as the number of pins on the device increases. An example of such a device is a pin grid array package having a plurality of pins which plug into holes in a printed circuit board so that a reliable soldered connection can be made. Such solder connections provide good electrical contact and have good mechanical properties. However, a soldered connection is in essence a permanent connection and it is often difficult to remove such a package without damaging it or the board.

In order to provide a removable connection, it is common to pre-attach a spring-loaded retaining socket to the circuit board and to rely on the spring characteristics of the socket to retain the components in place. As the number of pins in a package increases, the amount of force required to overcome the cumulative resistance of a corresponding number of sockets may be so great that either the package and/or the circuit board becomes damaged by insertion or removal of the package.

U.S. Pat. No. 3,763,459 to Millis discloses a plug-in type socket for making temporary electrical connections with such packages without applying substantial insertion pressure. Millis discloses the mechanical actuation of a plurality of contact elements by a single actuating means. U.S. Pat. No. 3,315,212 to Peterson discloses a multi-pin connector assembly, including a cam-actuated movable connector block mounting flexible contacts. The mechanical retaining force of the above-mentioned devices is not always satisfactory particularly where the devices are exposed to shock or vibration. As a result, the Millis and Peterson type devices are limited to the temporary testing and evaluating of packages.

An extremely reliable contact which can be pre-soldered into a printed circuit board and which exerts a very strong retaining force on electrical components such as pins, after they are installed, is disclosed in commonly assigned U.S. Pat. No. 3,740,839. This patent discloses a resilient member such as a forked member fabricated from beryllium copper, having at least two tines capable of being moved inwardly, and when so moved, to exert an outward force on the means which is moving them inwardly. A band of heat-recoverable metallic material, for example, of a suitable alloy of titanium nickel, is placed around the exterior of the tines. When the metallic band is at a first temperature, it will be in its austenitic state, during which state it will have substantial strength and will attempt to assume a small diameter condition with the result that the tines will be pressed inwardly against any object inserted between them. Commonly assigned U.S. Pat. No. 3,861,030 utilizes a plurality of these individual contacts mounted with a plurality of tabs depending from an elongated carrier strip. It can be appreciated that as the number of contacts increase, the complexity and the cost of such a connector increases dramatically.

SUMMARY OF THE INVENTION

The purpose of the instant invention is to provide a connector for connecting insertable elements which are preferably electrically conductive members, e.g. a plurality of closely spaced pins and a substrate having contact elements, said connector providing high retention force, low or zero insertion force and requiring at least one heat-recoverable metallic member to actuate the connector. To accomplish this purpose, this invention comprises a connector having at least two boards which are substantially parallel to each other and at least one heat-recoverable metal motion-transmitting means interconnecting the boards enabling them to move relative to each other wherein the movement effects the engagement between the insertable elements. The motion-transmitting means may effect either engagement or, in another embodiment, may effect disengagement with the insertable elements.

One aspect of this invention resides in having a connector comprising:

a first board having a plurality of openings formed therethrough;

a second board having a plurality of openings formed therethrough, said second board being mounted generally parallel to said first board, the openings in said first board being complementary to the openings in said second board; and a motion-transmitting means of heat-recoverable metal having a martensitic state and an austenitic state, said means interconnecting said first and second boards to move the boards relative to each other, said means being expanded dimensionally while in its martensitic state, a change from its martensitic state to its austenitic state recovering said means to its non-expanded state, recovering said means to its non-expanded dimension, thus moving said boards relative to each other.

A primary object of the instant invention is to provide a connector which is capable of forming a strong physical connection with insertable elements such as the pins of a multipin module and the contacts of a substrate without applying the force in such a way that would bend or otherwise damage the pins or contacts.

Another object of the instant invention is to provide a connector which is extremely compact and has a minimum number of components.

It is still another object of the instant invention to provide a reusable connector for removable interconnection of insertable elements.

Other and further objects, features and advantages of the invention will be apparent from the following more particular description of preferred embodiments of the invention as illustrated in the accompanying drawings.

BRIEF DESCRIPTION OF THE DRAWING

FIG. 1 is an exploded view of an unassembled connector with an array package positioned above the connector. An optional biasing means is also shown in phantom.

FIG. 2 is a cross-sectional view taken along section line 2—2 of FIG. 1 showing the package positioned within the assembled connector prior to engagement with the pins of the package.

FIG. 3 is a cross-sectional view corresponding to FIG. 2 after engagement.

FIG. 4 is a cross-sectional view similar to FIG. 3 of an alternative embodiment.

FIG. 5 is a side view of the connector and an installed package with an opening means in the form of a separate removal tool initially placed in position but prior to operation of the tool.

FIG. 6 is a full-side view similar to FIG. 5 showing the separate removal tool after operation with the package shown disengaged.

FIG. 7 is a partial cross-sectional view of another alternative embodiment illustrating an individual self-biasing contact element.

FIG. 8 is a partial cross-sectional view similar to FIG. 2, but of alternative embodiment of the connector of the instant invention in its closed condition.

FIG. 9 is a cross-sectional view corresponding to FIG. 8 including an array package positioned over the connector with the connector in open condition.

FIG. 10 is a cross-sectional view corresponding to FIG. 9 after engagement of the connector (i.e., the interconnection of the insertable elements such as the pins of the array package).

FIG. 11 is a cross-sectional view similar to FIG. 2, but of still another alternate embodiment of the connector of the instant invention, with the connector in closed condition.

FIG. 12 is a cross-sectional view corresponding to FIG. 11 with an array package positioned over the connector when the connector is in open condition.

FIG. 13 is a cross-sectional view corresponding to FIG. 12 with the connector in closed condition after engagement with the insertable elements, i.e., the pins of the package.

FIG. 14 is a cross-sectional view similar to FIG. 2 but of a low-insertion-force embodiment of the instant invention with an array package positioned over the connector when the connector is in its closed condition.

FIG. 15 is a cross-sectional view corresponding to FIG. 14, illustrating insertion of the insertable elements or pins of the package, the insertable elements cooperating with contact surfaces of the connector to perform a wedge action which opens the connector after it is cooled.

FIG. 16 is a cross-sectional view corresponding to FIG. 15 with the connector warmed and therefore closed, i.e., after engagement of the connector with the insertable elements.

FIG. 17 is a partial cross-sectional view similar to FIG. 2 but of an alternative embodiment having an alternative exterior mounted heat-recoverable metal motion transmitting means and biasing means.

FIG. 18 is a perspective, partially cross-sectioned view of another embodiment of the instant invention illustrating an outboard motion-transmitting means of nonuniform cross-section. A representative bifurcated contact element is illustrated in the partial cross-sectional portion of the figure.

FIG. 19 is a partial cross-sectional view taken along section line 19—19 of FIG. 18, illustrating a zero-insertion-force device utilizing a bifurcated contact design prior to engagement with an insertable element.

FIG. 20 is a partial cross-sectional view corresponding to FIG. 19 after engagement of the contact element with the insertable element.

FIG. 21 is an exploded view similar to FIG. 1 of an alternative, unassembled connector having a motion-transmitting means comprising a grid having webs of varying cross-section.

FIG. 22 is a partially cross-sectioned perspective view that will be used to illustrate two alternate embodiments of the instant invention. FIGS. 23 and 24 illustrate one of said embodiments utilizing a motion-transmitting means in the form of a linear element to close the connector. FIGS. 25 and 26 illustrate the other embodiment wherein a motion-transmitting means in the form of a linear element is utilized to open the connector.

FIG. 23 is a partial cross-sectional view taken along section line A—A of FIG. 22 illustrating the connector in an open condition.

FIG. 24 is a partial cross-sectional view corresponding to FIG. 23 with the connector in closed condition.

FIG. 25 is a partial cross-sectional view of an alternate embodiment taken along section line A—A of FIG. 22 with the connector in closed condition.

FIG. 26 is a partial cross-sectional view corresponding to FIG. 25 with the connector in open condition.

FIG. 27 is a cross-sectional view of another embodiment of the instant invention positioned over a substrate having insertable elements in the form of substrate contact elements.

FIG. 28 is a cross-sectional view corresponding to FIG. 27 with the connector placed on the substrate.

FIG. 29 is a cross-sectional view corresponding to FIG. 28 including an array package after engagement of the connector with the insertable elements, the insertable element in this case being the pins of the array package and the contact elements of the substrate.

FIG. 30 is a cross-sectional view similar to FIG. 2 but of an alternate embodiment of the connector of the instant invention positioned over a substrate. A further modification of this invention is shown in phantom.

FIG. 31 is a cross-sectional view corresponding to FIG. 30 with the connector placed on the substrate but before engagement of the connector.

FIG. 32 is a cross-sectional view corresponding to FIG. 31 including an array package after engagement of the connector to the insertable elements, the insertable elements being the pins of an array package and the contact elements of the substrate.

DETAILED DESCRIPTION OF THE INVENTION

The connector of this invention comprises a compact assembly for mounting, and preferably releasably connecting an array package wherein the device provides high retention force and low insertion force. The number of insertable elements in the form of pins in such a package (usually more than one hundred) make interconnection impossible if the individual contacts in the connector have a high pressure contact force. Generally a compromise as to contact force is necessary thus destroying the integrity of the device during vibration or after the package is exposed to ambient conditions such as high humidity or salt spray. Because the speed of the signals transmitted in such packages is high, no signal interruption larger than a nanosecond is acceptable. During environmental conditions such as high vibration, this requirement is difficult to achieve with conventional connector designs. The use of a heat-recoverable metal having two phases allows the design of a connector which may have low insertion force and yet have high retention force. The instant invention provides an optimized connector utilizing heat-recoverable metals for low insertion force and high retention force in an extremely compact package having a minimum number of moving parts.

The connector of this invention comprises at least two generally parallel movable boards, both having openings, wherein the boards are interconnected by a motion-transmitting means which moves the boards relative to each other to secure and/or release insertable elements in the form of pins of an array package to a substrate having contact elements. In the preferred embodiment, a heat-recoverable metal motion-transmitting means comprises a grid of webs and slots which is sandwiched between the boards, one end of the grid connected to one board and the other end of the grid connected to the other board. In the simplest of embodiments, the low-profile, injection-moldable boards and the flat, machine-stampable grid produce a compact and reliable connector having a minimum number of components for securely but removably connecting an array package to a substrate.

The above-described connector is both physically and electrically compact. The connector has a low profile and a minimum plan surface area that facilitates high packing densities. The combined pin and contact length is at a minimum; thus the length of the signal transmission path is short, facilitating higher signal transmission speeds.

The connector of this invention may utilize a heat-recoverable metal motion-transmitting means to close the connector and a separate tool to open the connector, the tool defining an opening means preferably simultaneously cooling the heat-recoverable metal grid causing it to change metallurgical state and expanding the grid, releasing the array package.

The scope of the invention may further include a heat-recoverable metal motion-transmitting means to close the connector wherein the connector has surface areas which coact with the insertable elements to translate and amplify the insertion force of the insertable elements when such elements are inserted into the board to bias the motion-transmitting means to open the connector.

Further, the scope of the invention includes a heat-recoverable metal motion-transmitting means that may comprise a grid having webs of varying cross-section to promote even stress distribution within the grid to accommodate uneven pin distribution.

The scope of the invention includes a motion-transmitting means made from a trained heat-recoverable metal which will reversibly transform from its recovered austenitic state to its expanded martensitic state upon change in temperature to disengage insertable elements.

It must be further understood that the scope of the invention is generally independent of whether or not the connector is provided with internal electrical contacts except where said contacts perform a biasing function to open the connector. Also when contacts are provided in order to engage insertable elements, e.g. pins of an array package, then the contacts may provide some compliance.

The scope of the invention includes separate biasing means to bias the motion-transmitting means for disengagement and which may be made integral with one of the boards. The separate biasing means may be made integral with the individual contact elements contained within the board.

Also included within the scope of the invention are several arrangements where the heat-recoverable metal motion-transmitting means may be connected outboard of the boards. These arrangements include linear elements of uniform and non-uniform cross-section. One such motion-transmitting means includes a spring C-ring captured by a heat-recoverable ring, said ring acting as the heat-recoverable metal transmitting means to compress the C-ring and thus move one board relative to another for engagement. Upon change of metallurgical state, the spring force generated by the C-ring overcomes the heat-recoverable ring to disengage the pins of the multi-pin module.

The scope of the invention may further include a heat-recoverable motion-transmitting means to open the connector wherein a separate closing means in the form of a single spring-like member contacts the boards. Also included in this concept is the use of other closing means configurations including the use of individual contacts to bias the boards and to make electrical and mechanical contact.

The invention is more fully described with reference to the preferred and alternate embodiments illustrated in the accompanying drawing. It is to be understood that other embodiments are possible, as will be apparent to one skilled in the art.

FIG. 1 illustrates an exploded view of the connector referred to generally at 10. Positioned above connector 10 is a pin grid array package shown generally at 12 having a plurality of pins 14 extending therefrom. Pins 14 are called insertable elements. Pins 14 may be arrayed in various geometric configurations and may be of various cross sections. Connector 10 comprises a first board 16, a second board 18 and a heat-recoverable metal motion transmitting means in the form of a grid 20 positioned therebetween.

First board 16 contains a plurality of openings 22 formed therethrough which are complementary in number and array to pins 14 of the package 12. Second board 18 contains a plurality of openings therethrough containing contact elements shown typically by contact element 24 which are complementary in array and compatible in size to the openings 22 and which, when the connector is assembled (See FIGS. 2 and 3) extend into said openings 22. These contact elements may also be considered to be insertable elements in the broadest sense. Contact elements 24 are designed to be compliant as to pins 14. The pins will be discussed later with respect to FIG. 2. Openings 22 are sufficiently large so as to accommodate contact elements 24 and pins 14.

The preferred heat-recoverable metal motion transmitting means comprises a grid 20 which causes engagement between insertable elements that may be inserted into the openings in the boards. The grid 20 has a first end 26 and a second end 28 and having webs 30 which extends between said first and second ends 26 and 28, defining slots 32 between the webs 30. The grid is positioned between the first board 16 and the second board 18. The slots 32 are wider than the width of the openings 22 and contact elements 24 so as to be insulated from the contact elements 24 and the pins 14 that may be inserted into the openings 22. The first end 26 of the grid 20 is connected to the first board 16 and the second end 28 of the grid 20 is connected to the second board 18 by fastener means 34 shown generally as rivets. Other fastening means including the integral molding of the grid within the boards are within the scope of the invention.

Tool openings 36 are provided in the grid 20 and the first and second boards 16 and 18 to accommodate an opening means as will be appreciated more clearly in the discussion of FIGS. 5 and 6. Fastener means 34 are preferably staggered with respect to tool openings 36 and extend through holes 38 in the boards 16 and 18, into holes 40 in the grid 20. It is within the scope of the invention that the fastener means act as a tool connection. For example, the fastener means 34 may comprise hollow rivets (not shown) into which the tool may be inserted. Such an arrangement allows uniform stress distribution within the grid 20 during expansion.

Boards 16 and 18 preferably have recesses to insulate and slidingly receive webs 30 of the grid 20. The recesses area noted generally by 42 can be clearly seen with respect to second board 18. It is noted that the underside of first board 16 cannot be seen in FIG. 1, but it is understood that its recessed area is identical to second board 18. Recess 42 in turn comprises channels 44 and open portion 46. Channels 44 accommodate webs 30 and open portions 46 accommodate first and second ends 26 and 28 of the grid 20.

FIG. 1 also illustrates in phantom an opening means in the form of alternate resilient members 48 mounted to the upper surface of the second board 18 and complementary interfaces 50 within the lower surface of first board 16. Resilient members 48 and complementary interfaces 50 define a separate biasing means which biases said first board 16 relative to said second board 18 to disengage pins 14 when the grid 20 no longer overcomes the forces created by the biasing means. It is understood that such a separate biasing means defined by resilient members 48 and complementary interfaces 50 is also applicable to the other embodiments such a those illustrated in FIGS. 2-4 and 9-14. A separate biasing means is considered an optional feature to all of the embodiments.

FIG. 1 alone illustrates retention clips 51 and complementary detents 53. The clips 51 connect the first and second boards 16 and 18 vertically yet allow translational movement of the boards relative to each other in the direction of grid expansion and recovery. Other functionally similar retention means such as integral molding of the boards with complementary sliding rails (not shown) are within the scope of the invention.

Heat-recoverable metal motion transmission means, whether in the form of the grid 20 shown in FIG. 1 or in other optional forms within the scope of the invention, are formed from heat-recoverable metal. Heat-recoverable metals are disclosed in U.S. Pat. No. 3,012,882 and U.S. Pat. No. 3,174,851, and Belgian Pat. No. 703,649, the disclosures of which are incorporated by reference herein to illuminate the background of the present invention. As made clear in these patents, these alloys undergo a transition between an austenitic state and a martensitic state at certain temperatures. When they are deformed while they are in the martensitic state, they will retain this deformation while maintained in this state, but will revert to their original configuration when they are heated to a temperature at which they transform to their austenitic state. This ability to recover upon warming has been utilized in commonly assigned U.S. Pat. Nos. 4,035,007 and 4,198,081, which are incorporated by reference herein. The temperatures at which these transitions occur are affected, of course, by the nature of the alloy. A group of alloys having a particularly useful transition temperature are disclosed in commonly assigned U.S. Pat. Nos. 3,753,700 and 4,337,090 which are also incorporated herein by reference. A heat-recoverable metal motion transmission means may be fabricated from a heat recoverable metal material, for example, the titanium nickel alloy disclosed in U.S. Pat. No. 3,753,700.

While heat-recoverable metals have been known for some time, their use in connecting devices has been limited by the relatively small percent of recoverable deformation they exhibit when they are recovered. The amount of recovery is dependent upon the alloy used, as well as by the means in which it has been expanded or deformed. The recovery is typically limited to 6 to 8 percent strain. Furthermore, those alloys which exhibit the desired heat recoverability are not necessarily themselves excellent electrical conductors, nor do they necessarily exhibit the ability to be readily soldered. The grid 20 of FIG. 1, having long webs 30, provides a heat-recoverable metal motion-transmitting means having more extension and more subsequent motion.

Similarly, long external motion-transmitting means 222 are disclosed with respect to FIGS. 18-20. There, unlike the grid 20, the cross-sectional area of the means 222 varies to optimize the heat-recoverable strain behavior as will be explained later.

As shown in FIG. 2, grid 20, particularly webs 30, are expanded. Grid 20 has recovered to its original smaller dimension as shown in FIG. 3. This recovery is facilitated by a change from one expanded metallurgical state to another metallurgical state, said change causing movement of the first and second boards relative to each other. This in turn causes engagement between the contact elements 24 and the pins 14.

Where the heat-recoverable metal motion-transmitting means is made from a shape-memory alloy having a martensitic state and an austenitic state, motion of the boards relative to each other is accomplished by expanding the grid 20 while it is in its martensitic state and then changing the length of the grid by a change in temperature to its austenitic state. The change in metallurgical state recovers the grid to its nonexpanded dimension. The first and second boards 16 and 18 thus move relative to each other, causing engagement between the contact elements 24 and the pins 14.

To utilize the properties of a heat-recoverable metal in the connector of the instant invention, it is necessary to obtain an expanded martensitic state and a recovered austenitic state. The recovered austenitic state is inherent in the material but the expanded martensitic state must be obtained by one of the following methods.

The first method for obtaining an expanded martensitic state is to cool the heat-recoverable metal motion transmitting means or grid 20 below its martensitic transformation temperature and then expand the grid dimensionally by mechanical means such as the tool 58 or a separate biasing means. Upon heating, the material will return to its original or nonexpanded austenitic state, overcoming if necessary the separate biasing means.

The second method for obtaining an expanded martensitic state is to apply a stress alone. Application of sufficient stress will cause simultaneous expansion of the grid and transformation of the material from its austenitic state to an expanded martensitic state. This type of behavior of the material is often referred to as its pseudoelastic behavior. However, martensite can be produced by stress only over a limited temperature range above its martensitic transformation temperature. Upon release of the stress, the material will revert to its original nonexpanded dimension and austenitic state. The grid can be so stressed by use of the tool 58.

The third method for obtaining an expanded martensitic state is to cool an appropriately trained grid below its martensitic transformation temperature. Some heat-recoverable alloys after repeated cycling by either of the first two methods above become "trained". An external mechanical means for expansion is no longer required and the "trained" grid will spontaneously expand with cooling alone. Such a phenomena is discussed in *Treatises in Metallurgy* edited by J. F. Tien and J. F. Elliott, 1981, in the chapter titled "Fundamentals of Martensitic Reaction" by M. Cohen and C. M. Wayman. This chapter is incorporated herein by reference. This behavior of the material is often referred to as its "two way" shape memory effect. The motion-transmitting means shown in FIGS. 1-4, 14-16, 18, 21, and 27-32 may optionally be made from a trained heat-recoverable metal which will reversibly transform from its recovered austenitic state to its expanded martensitic state upon change in temperature.

Selection of one of the above means will be determined by the specific properties of the alloys and the connector operating conditions. Basically, all of the connectors disclosed herein may be made utilizing a motion-transmitting means of heat-recoverable metal which obtains an expanded martensitic state by any of the three aforementioned methods.

FIG. 2 shows in full section view the connector of FIG. 1, with the package 12 inserted therein but prior to recovery of the grid 20 which is expanded. It can be seen that the insertable elements or pins 14 of the package 12 extend into the openings 22 without interference with the contact elements 24. No interference means low or zero resulting insertion force. Contact elements 24 are compliant by nature of their shape or material composition. Specifically, contact elements 24 are of cantilever bean construction and are shown generally to have a straight section 52 and an inclined section 54. Straight section 52 is associated with second board 18 and inclined section 54 extends into openings 22. The lower portion of straight section 52 is utilized to permanently interconnect the connector with associated electronics (not shown). Inclined section 54, as can be clearly seen in comparing FIGS. 2 and 3, is compliant in that it will move or straighten when engaging pins 14 of the package 12 upon recovery of the grid 20. Compliant contact elements are important to the instant invention in that the contact elements will elastically deform to accommodate dimensional variations in both the package 12 and the connector 10 thus not damaging the pins 14. Such damage could destroy the removability and the reuse of package 12. Other compliant contact element configurations, such as bifurcated contact elements, are considered to be within the scope of the invention. Such a contact is specifically disclosed in FIGS. 18-20 hereof. It is also understood that other contact element designs which may be attached to either board 16 or board 18 are within the scope of the invention. It is also within the scope of the invention to have the contact elements associated with an external substrate as will be discussed further with respect to FIGS. 27-29.

FIG. 3 illustrates the connector of FIG. 2 with the grid 20 in its recovered state. It can be seen that the inclined section 54 of contact element 24 has been engaged with insertable element or pin 14 and that it has straightened generally into alignment with straight section 52. With grid 20 recovered, the connector provides high retention force on package 12.

FIG. 4 illustrates an alternate embodiment of the connector shown in FIGS. 1 through 3. Specifically, FIG. 4 illustrates a second board 18 which will accommodate a package 12 having an elongated pin 14'. Board 18 is provided with additional pin openings 56 complementary to the openings in said first board 16 into which the elongated pins 14' may be inserted.

Contact elements 24' are shown to be associated with the second board 18 but it is understood that the attachment of the contact elements 24' to either board is within the scope of the invention. Again, it is also within the scope of the invention to have boards without contact elements as will be described in detail with respect to FIGS. 27-29.

FIGS. 5 and 6 illustrate the operation of an opening means in the form of a separate removal tool shown generally at 58. Tool 58 comprises first and second members 60 and 62, respectively, having connector contact portions 64 and 66, respectively, which thermally and mechanically contact the connector 10 to facilitate release of a package 12 after it has been installed and the grid 20 has been recovered. Tool 58 also includes an expansible means 68 shown in the form of a spring in tension interconnecting members 60 and 62. In FIG. 5, grid 20 is shown to be recovered and package 12 has been securely engaged within the connector 10 by relative movement of boards 16 and 18. In the preferred embodiment, grid 20 has previously gone from its martensitic state to its austenitic state and has moved the first and second boards relative to each other. In the austenitic state, the heat recoverable metal effects high retention force engagement. In this instance, if the grid is returned from its austenitic state to its martensitic state, the grid 20 will weaken but will not, of its own accord, change in dimension. Thus, opening means in the form of a tool 58 or some optional portion of the connector 10 such as the resilient members 48 and complementary interfaces 50 must be utilized to disengage or open the connector 10. Resilient members 48 will be discussed in detail later. It is understood that a grid 20 made from a "trained" heat-recoverable metal will expand to disengage by cooling alone.

For purposes of discussion, the alloy utilized in the grid 20 is one which is in its martensitic state when relatively cold and which changes to its austenitic state when warmed. In this instance, removal of the package 12 is accomplished by applying tool 58 which is cold and which through thermal conduction through portions 64 and 66 will cool grid 20 causing grid 20 to go from its austenitic state to its relaxed martensitic state. Optional grid cooling fins (shown in FIGS. 8-10) may be provided. The cooling fins would extend vertically upward to make further contact with portions 64 and 66. The purpose of fins would be to enhance conductive cooling of the grid 20. Expansible means 68 of tool 58 automatically moves the members 60 and 62 relative to each other to expand the grid 20 that has been cooled by portions 64 and 66. With grid 20 expanded, package 12 may be inserted or removed as can be seen in FIG. 6.

The same biasing function of an opening means accomplished by the tool 58 may be incorporated into the connector 10 by the use of openings in the form of the resilient members 48 and complementary interfaces 50. Such resilient members operate as a separate biasing means to disengage the pins of the package when the alloy of the grid 20 is cooled by some external means (not shown) such as liquid nitrogen. In either instance, whether an external tool tool is utilized or where integral biasing means are provided, improved thermal insulation and movement of the grid 20 is enhanced by the utilization of a coating 70. The coating 70 on webs 30 may be seen in FIG. 1. Such a coating 70 insulates the webs 30 to reduce heat transfer to the boards, thus improving overall heat transfer. The coating also decreases friction between the grid 20 and the first and second boards 16 and 18. A coating of a fluoropolymer material is preferred.

FIG. 7 shows still another alternate embodiment wherein opening means comprises forked contacts 24" having tines 82 and 84 are utilized to both engage the pins 14 of a package 12 and bias boards 16" and 18". Inclined tine 84 is shown in contact with board 16" to bias the board 16" relative to the board 18". The connector is shown in the open condition where the grid 20' has been expanded while in its weakened martensitic state. Grid 20' when warmed, recovers, overcoming the biasing of tine 84 causing the capture of pin 14 between itself and tine 82. Forked contacts 24" may also be used in conjunction with the embodiments illustrated in FIGS. 27-32. In FIG. 7 the contact is shown biasing the grid 20 open. It is possible to reverse the biasing direction such that the contact biases the connector closed and the motion-transmitting means is used to open the connector as is discussed further with respect to FIGS. 11-13.

FIG. 8 illustrates a connector having a first board 150 having a plurality of openings 152 formed therethrough and a second board 154 having a plurality of openings 156 formed therethrough, the second board 154 being mounted generally parallel to said first board 150, the openings 152 in the first board being complementary to the openings 156 in the second board. Contact elements 158 are connected to one of said boards, preferably to board 154, and occupy the openings 156. A motion-transmitting means 160 of heat-recoverable metal is connected to first board 150 by mechanical means 162 shown as a rivet. The other end of motion-transmitting means 160 is connected to the second board 154 by mechanical means 164, also shown as a rivet, thus interconnecting the first and second boards to move the boards relative to each other. The connector further includes opening means contacting said boards to bias said first board relative to said second board to disengage insertable elements that may be inserted into the complementary openings of the first board when said heat-recoverable metal goes from its austenitic to its martensitic state. The opening means comprises a separate biasing means 166 which is a spring-like member which shifts the first board 150 relative to board 154 as can be seen in FIG. 9.

The opening means comprises a biasing means 166 that may be a separate spring or may be a continuation of the heat-recoverable metal utilized as the motion-transmitting means 160. In this regard, the biasing means 166 must retain sufficient spring-like character to move the boards relative to each other to open the connector, as shown in FIG. 9. In FIGS. 8-10 the motion-transmitting means 160 is preferably in the form of a grid having openings 168. The grid is provided with an extending fin 171 which may be cooled to cause the heat-recoverable metal to go from its austenitic state to its martensitic state, thus opening the connector. To retain sufficient spring-like character, biasing means 166 must remain in its austenitic state.

FIG. 9 illustrates the connector in the open position wherein biasing means 166 has moved first board 150 to expose openings 152 for insertion of insertable elements 170 in the form of pins of an array package 172 into the openings 152.

In FIG. 10 the motion-transmitting means has changed from its martensitic state to its stronger austenitic state, recovering to its non-expanded dimension, thus moving the boards relative to each other to force contact elements 158 into engagement with insertable elements 170.

FIGS. 11-13 illustrate an alternative embodiment of the instant invention wherein the motion-transmitting means of heat-recoverable metal causes disengagement between insertable elements and the complementary openings of at least one of said boards when said metal goes from its martensitic to its austenitic state.

In FIG. 11, first board 174, having a plurality of openings 176 therethrough, is mounted generally parallel to second board 178, having openings 180 formed therethrough, said openings 180 being complementary to said openings 176. In this embodiment, contacts 182 may optionally be provided. It will become apparent later with respect to the discussion of FIGS. 27-29 that contact elements are optional, depending upon the availability of insertable elements from both sides of the connector. A motion-transmitting means 184 of heat-recoverable metal, again preferably in the form of a grid having at least one slot 186, interconnects first board 174 to second board 178. Motion-transmitting means 184 is connected to first board 174 by mechanical means such as rivets 188 and to second board 178 by mechanical means such as rivets 190. In this embodiment, a closing means 192 is provided. Closing means 192 contacts first board 174 at the end of first board 174 and is fastened to second board 178 by preferably the same mechanical means, rivet 190. Closing means 192 therefore interacts between first board 174 and second board 178 to bias first board 174 relative to second board 178 to engage insertable elements 194, shown to be the pins of an array package 196. The closing means 192 is shown to be a spring-like member which expands as can be seen by comparing FIGS. 12 and 13. It is within the scope of the invention to have the closing means incorporated with the contacts themselves. In this case, contacts (not shown) similar to the ones shown in FIG. 7 may be used where each contact inherently grips a complementary insertable element to make electrical and mechanical contact. In this embodiment the motion-transmitting means would open the connector by having the relative motion of the boards overcome the closing force of the contacts.

The motion-transmitting means 184 of heat-recoverable metal having a martensitic state and an austenitic state will open the connector when changed from its martensitic state to its austenitic state, i.e., when recovering to its non-expanded dimension, thus moving the boards as can be seen in FIGS. 11 and 12. The closing means 192 will expand the motion-transmitting means when the motion-transmitting means is cooled, returning it to its weakened martensitic state, thus closing the connector.

FIGS. 14-16 illustrate yet another embodiment of the instant invention wherein said connector further includes opening means to bias said first board relative to said second board. One of said boards is provided with opening means in the form of inclined contact surfaces complementary to the openings in said board, said surfaces defining a means for translating and amplifying the insertion force of insertable elements when inserted into said openings to bias said first board relative to said second board when said heat-recoverable metal is in its martensitic state, expanding said heat-recoverable metal motion-transmitting means.

Illustrated in FIGS. 14-16 is a connector comprising a first board 198 having a plurality of openings 200 formed therethrough and a second board 202 having a plurality of openings 204 formed therethrough. Said second board is mounted generally parallel to said first board, the openings 200 of said first board 198 being complementary to the openings 204 in said second board 202. In this embodiment optional contacts 206 are illustrated, and occupy the openings 204 in second board 202. A motion-transmitting means 208 of heat-recoverable metal, again having a martensitic state and an austenitic state, interconnects the first and second boards to move the boards relative to each other, to close the connector. The motion-transmitting means is expanded dimensionally in its martensitic state by a unique aspect of this embodiment. Specifically, one of the boards, shown here to be first board 198, is provided with inclined surfaces 210 which are complementary to the openings 200, said surfaces 210 defining a means for translating and amplifying the insertion force of the insertable elements 212. This can be seen more clearly in FIG. 15, where elements 212 are inserted into said openings 200 to bias said first board 198 relative to said second board 202 when said heat-recoverable metal is in its martensitic state, expanding said heat-recoverable metal motion-transmitting means 208. Motion-transmitting means 208 is connected to the first and second boards by mechanical means as discussed earlier.

FIG. 17 illustrates yet another embodiment wherein the heat-recoverable metal motion-transmitting means comprises a heat-recoverable metal ring 72 which completely encircles yet another opening means comprising biasing means in the form of a spring C-ring assembly noted generally at 74. FIG. 7 is a cross-sectional side view of this embodiment. It is understood that spring C-ring assembly 74 extends substantially across the width of a first board 16' and that more than one heat-recoverable metal ring 72 may be provided along the axial length of the spring C-ring assembly 74. Spring C-ring assembly 74 comprises a generally cylindrical spring body portion 76, extending transversely across the surface of first board 16', and depending pegs 78 and 80 which are attached to boards 16' and 18'. Peg 80 is secured to first board 16' and peg 78 is secured to second board 18' through an oversized opening in first board 16'. The use of a plurality of pegs 78 and 80 extending transversely across the surfaces of the boards is within the scope of the invention.

The heat-recoverable metal ring 72 is shown in its recovered or austenitic state, wherein it has compressed or squeezed spring C-ring assembly 74 to move first board 16' relative to second board 18' forcing pins 14 into secure engagement with contact member 24. Contact member 24 may optionally be associated with an external substrate. If the heat-recoverable metal ring 72 was, as described with respect to the other embodiments, cooled so as to return to its weakened or martensitic state, then the spring force exerted by spring C-ring assembly 74 and as transmitted by pegs 78 and 80 would overcome the compressive forces of heat-recoverable metal ring 72, radially expanding the heat-recoverable metal ring 72, moving the boards relative to each other and disengaging or opening the connector.

FIGS. 18-20 disclose yet another embodiment of the instant invention wherein the motion-transmitting means is mounted outside the boards. The motion-transmitting means is preferably non-uniform in cross-section to optimize the heat-recoverable strain behavior of the heat-recoverable metal. This embodiment illustrates but is not limited to the use of bifurcated contact elements shown more specifically in FIGS. 19 and 20.

Illustrated in FIGS. 18-20 is a first board 214 having a plurality of openings 216 formed therethrough. Also provided is a second board 218 having a plurality of openings 220 formed therethrough, said second board 218 being mounted generally parallel to said first board 214, the openings 216 in said first board 214 being complementary to the openings 220 in said second board 218. A motion-transmitting means 222 of heat-recoverable metal interconnects first board 214 to second board 218 to move said boards relative to each other, said motion-transmitting means being expanded dimensionally while in its martensitic state, a change from its martensitic to its austenitic state recovering said means to its nonexpanded dimension, thus moving said boards relative to each other.

Motion-transmitting means 222 is preferably non-uniform in cross-section to optimize the heat-recoverable strain behavior of the heat-recoverable metal. Specifically, the motion-transmitting means is a linear element, a portion thereof, the center portion, having a reduced axial cross-section. The purpose of the reduced cross-section is to define and limit the area undergoing expansion during austenite-to-martensite transition, thus enabling the motion-transmitting means to operate at the most efficient strain range for a particular application. It is understood that although a rod or bar-like member is shown, the motion-transmitting means may be of varying general configuration as, for example, a tube having a drawn-down center portion, or a rectangular bar having a reduced center cross-section. In this embodiment, the motion-transmitting means is used to close the connector. In this embodiment, a trained heat-recoverable metal which will reversibly transform from its recovered austenitic state to its expanded martensitic state upon a change in temperature may be utilized to disengage insertable elements. Optionally, a separate opening means may be provided. In addition, it is also possible to vary the cross-section in more than one area for optimum thermal access.

FIGS. 19 and 20 illustrate a bifurcated type of contact 224 inserted into opening 220 of second board 218. It can be seen in FIG. 18 that contact 224 can slidingly receive insertable element 226. In this embodiment, the electrical contact is provided by contact 226 alone. In the embodiment of FIGS. 18-20, the motion-transmitting means 222 merely moves the insertable element 226 into the contact 224. The bifurcated contact 224 provides all the mating force required to ensure electrical/mechanical integrity. The contact force is determined by the bifurcated contacts themselves rather than in the embodiment of FIG. 1 where the contact force is a function of the remaining stress in the motion-transmitting means.

FIG. 21 illustrates yet another embodiment of the instant invention wherein the motion-transmitting means may be of varying cross-section to promote even stress distribution within the motion-transmitting means. The connector is substantially identical to that described in FIGS. 1-3 with the exception that the motion-transmitting means is in the form of a grid 244 having webs of varying cross-section. Grid 244 has webs 246 of small cross-section and webs 248 of large cross-section. The webs of large cross-section correspond to the areas of the array package with the greater number of pins; conversely, the webs of smaller cross-section correspond to the areas of the array package with the fewer number of pins. This acts to promote uniform stress distribution in the grid and with respect to the mating forces distributed over the array package. It is understood that the greater the number of insertable elements, the larger the corresponding cross-sectional area of the web.

FIGS. 22–26 illustrate two embodiments of the instant invention wherein the motion-transmitting means is a linear element and wherein an additional spring-like member is mounted concentrically with respect to said linear element.

FIG. 23 illustrates a first board 258 having openings 260 therethrough and a second board 262 having openings 264 therethrough. Contact elements 266 are shown to occupy openings 264. A motion-transmitting means 268 interconnects first board 258 to second board 262. The motion-transmitting means 268 is a linear element shown to be a turned-down rod or bar of heat-recoverable metal. In the embodiment of FIGS. 23 and 24, motion-transmitting means 268 recovers to move insertable elements 270 into engagement with contacts 266. In FIGS. 23 and 24, opening means 272 is in the form of concentrically mounted spring-like member (Bellville washers) which oppose but are overridden by the recovery of motion-transmitting means 268.

FIGS. 25 and 26 illustrate exactly the opposite phenomena wherein motion-transmitting means 271 recovers to disengage insertable elements 270 from contacts 266. Additional closing means 273 in the form of concentrically mounted spring-like members (Bellville washers) oppose but are overridden by the recovery of the motion-transmitting means 271.

FIG. 27 illustrates the connector of the instant invention referred to generally at 10'. Connector 10' is positioned over a substrate shown generally at 84 before engagement of the connector 10' with the substrate 84. Connector 10' comprises a first board 86, a second board 88, and a heat-recoverable metal motion-transmitting means in the form of a grid 90 positioned therebetween.

First board 86 contains a plurality of openings 92 formed therethrough which are complementary in number and array to the openings 94 of second board 88.

Substrate 84 includes contact elements 96 which are mechanically and electrically connected to circuit conductors 98, which are shown to be a printed circuit on the surface of substrate 84. Contact elements 96 are designed to be compliant as to pins 14 of an array package 12.

Contact elements 96 are shown generally to have a straight section 100 and an inclined section 102. Straight section 100 is associated with openings 94 in second board 88, and inclined section 102 extends into openings 92 in first board 86 as can be more clearly seen in FIG. 28. The lower portion of straight section 100 is utilized to permanently interconnect the contact element with surface conductors 98. As compared with the previously discussed embodiments of FIGS. 1–8, the connector 10' of the instant invention lacks contact elements which may be provided by associated electronics in the form of substrate 84. In this embodiment, compliant contact elements are important but not essential for the successful operation of the connector 10'. It is understood that other contact element designs which will interface with connector 10' and the pins of a package 12 are considered to be within the scope of the invention. As mentioned earlier with respect to FIG. 7, the forked contacts 24" which provide self-biasing, could also be used, as can be appreciated by one having ordinary skill in the art.

With regard to FIG. 28 it can be seen that the openings 94 of second board 88 provide a press fit with the straight sections 100 and the contact elements 96. The press fit firmly secures the connector 10' to substrate 84 prior to the engagement of the connector, that is, prior to the interconnection of the pins 14 of a package 12 with the contact elements 96 of a substrate 84. Straight section 100 of contact element 96 also serves as a lateral anchor for second board 88, as will be appreciated after the discussion of the operation of connector 10'.

The preferred heat-recoverable metal motion-transmitting means comprises a grid 90, which is identical in structure and operation to the grid 20 discussed earlier. The grid 90 is positioned between first board 86 and second board 88. First end 104 of the grid 90 is connected to the first board 86, and the second end 106 of the grid 90 is connected to the second board 88 by fastener means 108. Fastener means 108 are identical to fastener means 34, discussed earlier. Tool openings (not shown) are provided in the grid 90 and in the first and second boards 86 and 88. The tool openings are identical to tool openings 36 discussed with respect to the embodiment disclosed in FIG. 1. Likewise, fastener means 108 may comprise hollow rivets (not shown) into which a tool may be inserted.

FIGS. 27 and 28 show the connector 10' prior to the recovery of the grid 90 which is in its expanded state. Expansion of the grid by external mechanical means or by training the grid has been discussed previously. FIG. 29 illustrates the connector 10' with the grid 90 in its recovered state. It can be seen that the inclined sections 102 of the contact elements 96 have been engaged with pins 14 of the package 12. With the grid 90 recovered, the connector 10' provides high retention force on package 12.

FIGS. 30–32 disclose yet another embodiment of the instant invention wherein more than two boards are utilized and wherein more than one grid may be utilized. With reference to the drawing, a connector, shown generally at 10''', is disclosed, comprising a first board 110, a second board 112, and a third board 114. A heat-recoverable metal motion-transmitting means in the form of grid 116 interconnects first board 110 to second board 112. The heat-recoverable metal motion-transmitting means may also include a second grid 118 which is shown to interconnect second board 112 to third board 114.

Contact elements 120 are secured to second board 112. It can be seen that each of the contact elements 120 has a straight section 112 and inclined end sections 124. Straight section 122 is associated with second board 112, and the inclined sections 124 extend into the openings in either first board 110 or third board 114. The inclined sections are compliant, as discussed earlier with respect to other embodiments, so that they will elastically deflect when engaging pins.

FIG. 30 illustrates the connector 10''' with grids 116 and 118 in their expanded state. Connector 10''' is positioned above a substrate 126 having pins 128.

FIG. 32 illustrates an array package 12, connector 10''', and substrate 126 after engagement of connector 10'''. This means that the heat-recoverable metal motion-transmitting means in the form of grids 116 and 118 have recovered and the inclined sections 124 of the contact elements 120 have been deflected into general alignment with their respective straight sections 122. With the grids 116 and 118 recovered, the connector provides high retention force on package 112 and substrate 126.

The above description assumes that grids 116 and 118 are recovered simultaneously. It can be appreciated with reference to FIGS. 30 and 31 that grid 118 may be recovered to engage substrate 126 before package 12 is inserted into connector 10'''. Once package 12 is inserted into connector 10''', i.e., when the pins 14 of package 12 are inserted into the openings in board 110, then grid 116 may be recovered to engage connector 10''' with package 12.

With reference to FIGS. 30-32, it can be appreciated that for simultaneous engagement of connector 10''' with package 12 and substrate 126, the utilization of bridging element 130 shown on phantom would make grids 116 and 118 redundant. Specifically, in an alternate embodiment, bridging element 130 could be used to rigidly interconnect first board 110 with second board 114. In this embodiment, only one grid would be necessary to move first board 110 and third board 114 with respect to second board 112. For sake of illustration, two grids are shown, but it is understood that first board 110 may be rigidly secured to third board 114 with second board 112 positioned therebetween, and that a heat-recoverable metal motion-transmitting means may interconnect either the first board 110 and second board 112 or may interconnect second board 112 and third board 114 to move the first board 110 and third board 114 relative to second board 112.

It is within the scope of the invention to provide more than two board configurations with internal or separate biasing means as described earlier with respect to FIGS. 7-10. It is also within the scope of the invention to utilize two grids that recover at different temperatures.

While the invention has been particularly shown and described with reference to the preferred embodiments thereof, it will be understood by those skilled in the art that the foregoing and other changes in form and details may be made therein without departing from the spirit and scope of the invention, limited only by a just interpretation of the following claims.

What is claimed is:

1. A connector comprising:
   a first board having a plurality of openings formed therethrough;
   a second board having a plurality of openings formed therethrough, said second board being mounted generally parallel to said first board, the openings in said first board being complementary to the openings in said second board; and
   a motion-transmitting means of heat-recoverable metal having a martensitic state and an austenitic state, said means interconnecting said first and second boards to move the boards relative to each other, said means being expanded dimensionally while in its martensitic state, a change from its martensitic state to its austenitic state recovering said means to its non-expanded dimension, thus moving said boards relative to each other.

2. A connector as in claim 1 wherein the movement of at least one of said boards causes engagement between insertable elements that may be inserted into the complementary openings of said boards when said metal goes from its martensitic to its austenitic state.

3. A connector as in claim 2 wherein said motion-transmitting means comprises a grid having first and second ends and having webs of material extending between said first and second ends defining at least one slot between said webs, the openings of said first and second boards positioned so as to define engagement paths between said webs, the first end of said grid connected to said first board and the second end of said grid connected to said second board.

4. A connector as in claim 3 wherein said connector further includes opening means contacting said boards to bias said first board relative to said second board to disengage insertable elements that may be inserted into said openings in the boards when said heat-recoverable metal goes from its austenitic state to its martensitic state.

5. A connector as in claim 4 wherein said opening means and said motion-transmitting means are integral, said motion-transmitting means being made from a trained heat-recoverable metal which will reversibly transform from its recovered austenitic state to its expanded martensitic state upon change in temperature to disengage insertable elements.

6. A connector as in claim 5, further including contact elements connected to one of said boards, said contact elements being complementary to the openings in the other said board.

7. A connector as in claim 4 wherein said opening means comprises contacts associated with one of said boards, said contact elements being complementary with the openings of the other of said boards, said contacts biasing said boards relative to each other to disengage insertable elements that may be inserted into the openings of said other board when said heat-recoverable metal goes from its austenitic state to its martensitic state.

8. A connector as in claim 4 wherein said opening means comprises a separate biasing means to bias said first board relative to said second board to disengage insertable elements that may be inserted into said board openings.

9. A connector as in claim 8 further including contact elements connected to one of said boards, said contact elements being complementary to the openings in the other said board.

10. A connector as in claim 4 wherein said opening means comprises a tool which may be removably connected to said motion-transmitting means to expand said motion-transmitting means when said heat-recoverable metal goes from its austenitic state to its martensitic state.

11. A connector as in claim 10 further including contact elements connected to one of said boards, said contact elements being complementary to the openings in the other said board.

12. A connector as in claim 4 wherein said openings means includes inclined contact surfaces in one of the boards, said surfaces being complementary to the openings on said board, said surfaces defining a means for translating and amplifying the insertion force of insertable elements when inserted into said openings to bias said first board relative to said second board when said heat-recoverable metal is in its martensitic state, expanding said heat-recoverable metal motion-transmitting means.

13. A connector as in claim 12 further including contact elements associated with one of said boards and being complementary to the openings in the other said board.

14. A connector as in claim 2 wherein the motion-transmitting means is mounted external to said first and second boards.

15. A connector as in claim 14 wherein said motion-transmitting means is of varying cross-section to promote even stress distribution within the motion-transmitting means.

16. A connector as in claim 15 further including an opening means interconnecting said first and second boards to bias said first board relative to said second board to disengage elements that may be inserted into said openings in the boards when said heat-recoverable metal goes from its austenitic state to its martensitic state.

17. A connector as in claim 16 wherein said opening means comprises a split-ring spring-like member and said motion-transmitting means is a ringlike member, said motion-transmitting means surrounding said opening means.

18. A connector as in claim 17 further including contact elements associated with one of said boards and being complementary to the openings in the other said board.

19. A connector as in claim 14 wherein the motion-transmitting means produces a linear movement.

20. A connector as in claim 19 further including contact elements associated with one of said boards and being complementary to the openings in the other said board.

21. A connector as in claim 19 further including opening means interconnecting said first and second boards to bias said first board relative to said second board to disengage elements that may be inserted into said openings in the boards when said heat-recoverable metal goes from its austenitic state to its martensitic state.

22. A connector as in claim 21 further including contact elements associated with one of said boards and being complementary to the openings in the other said board.

23. A connector as in claim 21 wherein said opening means is a spring-like member which is concentrically mounted with respect to said motion-transmitting means.

24. A connector as in claim 23 further including contact elements associated with one of said boards and being complementary to the openings in the other said board.

25. A connector as in claim 14 further including an opening means interconnecting said first and second boards to bias said first board relative to said second board to disengage elements that may be inserted into said openings in the boards when said heat-recoverable metal goes from its austenitic state to its martensitic state.

26. A connector as in claim 25 further including contact elements associated with one of said boards and being complementary to the openings in the other said board.

27. A connector as in claim 1 wherein the movement of said boards causes disengagement between insertable elements that may be inserted into the complementary openings of said boards when said metal goes from martensitic to austenitic state.

28. A connector as in claim 27 wherein the motion-transmitting means produces a linear movement.

29. A connector as in claim 28, further including closing means interconnecting said boards to bias said first board relative to said second board to engage insertable elements that may be inserted into said complementary openings when said heat-recoverable metal goes from its martensitic state to its austenitic state.

30. A connector as in claim 29 further including contact elements associated with one of said boards and being complementary to the openings in the other said board.

31. A connector as in claim 29 wherein said closing means is a spring-like member concentrically mounted with respect to said motion-transmitting means.

32. A connector as in claim 31 further including contact elements associated with one of said boards and being complementary to the openings in the other said board.

33. A connector as in claim 1 wherein the motion-transmitting means is nonuniform in cross-section to optimize the heat-recoverable strain behavior of the heat-recoverable metal.

34. A connector as in claim 33 further including contact elements associated with one of said boards and being complementary to the openings in the other said board.

35. A connector as in claim 33 wherein the motion-transmitting means produces a linear movement, a portion of the motion-transmitting means having a reduced cross-section normal to the line of linear movement.

36. A connector as in claim 35 further including contact elements associated with one of said boards and being complementary to the openings in the other said board.

37. A connector as in claim 1, further including a third board having a plurality of openings formed therethrough, said third board being mounted parallel to said second board and said openings being complementary to the openings of said second board, and a second motion-transmitting means of heat-recoverable metal interconnecting said second and third boards to move said boards relative to each other, movement of said boards causing engagement between insertable elements that may be inserted into the openings of said second and third boards.

38. A connector as in claim 1, further including a third board having a plurality of openings formed therethrough, said third board being mounted parallel to said second board and said openings being complementary to the openings of said second board, said third board connected to said first board to move said first and third boards relative to said second board to cause engagement between insertable elements inserted into the first and second boards and cause engagement with insertable elements inserted into the second and third boards.

39. A connector as in claim 38 further including contact elements associated with one of said boards and being complementary to the openings in the other said board.

40. A connector as in claim 37 further including contact elements associated with one of said boards and being complementary to the openings in the other said board.

41. A connector as in claim 2, further including opening means interconnecting said boards to bias said first board relative to said second board to disengage insertable elements that may be inserted into said openings in the boards, said motion-transmitting means being made from a trained heat-recoverable metal which will reversibly transform from its recovered austenitic state to its expanded martensitic state upon change in temperature.

42. A connector as in claim 41 wherein said motion-transmitting means produces a linear movement.

43. A connector comprising:
  a first board having a plurality of openings formed therethrough;
  a second board having a plurality of openings formed therethrough, said second board being mounted generally parallel to said first board, the openings of said first board being complementary to the openings of said second board;
  a motion-transmitting means of heat-recoverable metal having a martensitic state and an austenitic state, said means interconnecting said first and second boards to move said boards relative to each other, movement of said boards causing disengagement between insertable elements that may be inserted into the openings of said boards when said metal goes from martensitic to austenitic state; and
  a closing means contacting said first and second boards to bias said boards relative to each other to move the boards relative to each other to cause engagement between insertable elements that may be inserted into the openings of said boards.

44. A connector as in claim 43 wherein said motion-transmitting means comprises a grid having first and second ends and having webs of material extending between said first and second ends defining at least one slot between said webs, the openings of said first and second boards positioned so as to define engagement paths between said webs, the first end of said grid connected to said first board and the second end of said grid connected to said second board.

45. A connector as in claim 44 further including contact elements associated with one of said boards and being complementary to the openings in the other said board.

* * * * *